June 21, 1966 R. R. DOUGLAS ETAL 3,256,586

WELDED CIRCUIT BOARD TECHNIQUE

Filed Jan. 4, 1962 2 Sheets-Sheet 1

INVENTORS:
Richard R. Douglas
William G. Reimann

By Alan C. Rose
Attorney

June 21, 1966 R. R. DOUGLAS ETAL 3,256,586

WELDED CIRCUIT BOARD TECHNIQUE

Filed Jan. 4, 1962 2 Sheets-Sheet 2

INVENTOR:
Richard R. Douglas
William G. Reimann

By Alan C. Rose
Attorney 3,256,586

WELDED CIRCUIT BOARD TECHNIQUE

Richard R. Douglas, Woodland Hills, and William G. Reimann, Los Angeles, Calif., assignors to U.S. Engineering Co., Inc., Van Nuys, Calif.

Filed Jan. 4, 1962, Ser. No. 164,359
12 Claims. (Cl. 29—155.5)

This invention relates to printed circuit boards and more particularly to an improved form of welded circuit board and method for fabricating the boards.

In order to provide improved shock resistance, it is desirable to make printed circuit board assemblies with welded connections to the associated components, rather than with soldered connections. To facilitate the welding of printed circuit boards to components, it has been proposed that the circuit patterns be provided with conductive tubes at the points where the components are to be electrically and physically connected to the conductors. When these tubes are formed of nickel, the welding of interconnections is greatly simplified, as a single form of welding electrode and standard welding current pulses may be employed, notwithstanding the use of electrical component having leads of different materials.

In the fabrication of the printed circuit boards of the type briefly described in the preceding paragraph, certain unnecessarily complicated methods have been proposed. Thus, for example, it has been proposed to initially form a master template mold having a series of holes corresponding to the connection points of the circuit boards. Subsequently, a matching electroplating form of resilient material is molded with protrusions corresponding to the holes in the original template. A coating of nickel is then built up on the flat surface and around the protrusions by known electroplating techniques, to form the conductive portions of the circuit board. Subsequently, the resultant flat portions of the conductive material, together with the tubes formed around the protrusions of elastic material, are separated from the resilient material; they are then secured in the proper positions on an apertured insulating board to form the completed printed circuit board.

The foregoing process has certain disadvantages. Specifically, it is difficult to remove the flat conductive strips with their associated tubes of conductive material from the resilient material without deformation. It is also time-consuming and expensive to relocate the strips in their proper positions on the apertured insulating board.

The principal object of the present invention, therefore, is to simplify and reduce the cost of preparing welded printed circuit boards.

In accordance with the present invention, this object is achieved through the use of a removable electroplating form which has holes or recesses in its surface, in place of the electroplating form having protrusions. Through the use of a removable electroplating member having apertures, the welding tubes may be formed within the electroplating guide rather than above its surface. The next subsequent method step may therefore be the bonding of the apertured insulating board to the exposed surface of the conductive strips. When the removable electroplating form is separated from the remainder of the assembly, the printed circuit board is virtually complete, requiring only an etching step prior to use in the manufacture of electronic component assemblies.

In accordance with a feature of the invention, the electroplating guide member may be formed by casting, through the use of a mold having protruding pegs. These pegs may be arranged either in a regular array or in a specific geometric configuration in accordance with the particular circuit board which is to be constructed.

The complete process of forming the circuit board may include the steps of preparing a pegboard mold, casting the removable electroplating form so that it has apertures corresponding to the pegs in the original mold, and coating the form with a thin layer of conductive material such as copper. In applying the copper coating, an electroless copper plating solution is first employed to give electrical continuity; then copper may be electroplated to build up a coating of about 0.0001 or 0.0002 inch of copper. A so-called "resist" material, to which plating material will not adhere, is then applied over the thin copper layer in places where no further conductive coatings are desired. As an alternative or in addition to the use of the resist material, the thin initial copper layer may be mechanically removed in areas, such as the lower surface of the form, where additional conductive coatings are not desired. A very thin layer of gold may then be electroplated over the copper layer for a purpose which will be discussed in connection with the finishing step. A relatively thick coating of nickel and another thin layer of gold may then be electroplated over the first layer of gold. The layers of gold and nickel extend through the holes which are present in the electroplating form, to provide welding tubes. Suitable interconnections between the various plated holes are provided by plated connections extending along areas which have not been treated with the resist. An insulating circuit board base member is then secured to the strips of nickel-plated conductive material on the electroplating form. The circuit board base may, for example, be a fiberglass epoxy laminate, and it may be secured to the electroplating conductive material by a suitable dry film adhesive or an epoxy cement. The apertured electroplating form is then removed from the electroplated material and the circuit board base to which it is now secured. In the next step, the copper is etched away by known solutions which will not dissolve gold. The thin gold layers which cover the nickel protect the nickel strips and tubes from dissolving in the course of the etching step. Following the preparation of the circuit boards, electrical components may be secured to them by the insertion of the component leads through the nickel tubes and aligned apertures in the circuit board base, and by clamping the nickel tubes against the leads and welding each tube and lead together.

In the foregoing paragraph, a detailed illustrative method for preparing printed circuit boards has been described. It is to be understood that the present invention relates primarily to the concept of securing the printed circuit board base to the exposed side of the electroplated conductors with their integral tubes, while they are maintained in their proper relative positions on the electroplating form. This may advantageously be accomplished by the use of an apertured electroplating form, rather than one having protrusions, so that the tubes employed in the welding connections extend away from the circuit board. The image of the printed circuit pattern may also be more readily printed on the electroplating form when the form is apertured. With regard to the other steps in the method, they supplement the principal concepts and are disclosed for the purpose of completeness.

The novel features which are believed to be characteristic of the invention both as to its organization and the method of construction, together with further objects, features and advantages thereof, will be better understood from the following description considered in conjunction with the accompanying drawing which illustrates the techniques of the invention. It is to be expressly understood, however, that the drawing is for the purposes of illustration and description only and does not constitute a limitation of the invention.

Figures 1, 2:
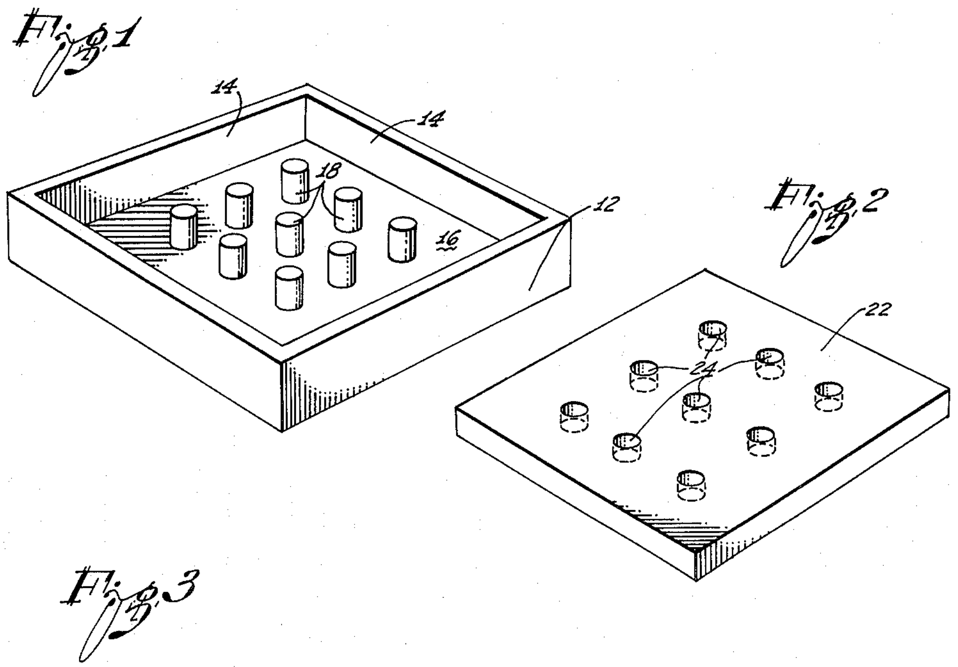
FIG. 1 shows a mold which may be used to cast the electroplating forms of the present invention.
FIG. 2 shows a typical electroplating form made from the mold of FIG. 1.

Referring more particularly to the drawing, FIG. 1 shows a small size mold for the casting of electroplating guides. The mold of FIG. 1 includes a base 12 having four sides 14 which are tapered slightly for ease in the removal of the cast form. Located on the inner surface 16 of the mold are a series of upstanding pegs 18. The mold of FIG. 1 is preferably of metal. The pegs 18 may be screwed into threaded openings (not shown) extending through the surface 16. If it is desired to eliminate a peg, a suitable bolt having a flat end surface may be threaded into the opening from the underside of the mold. While the mold and the resultant form and printed circuit board are of relatively small size in the present illustrative embodiment of the invention, it is to be understood that larger and more complex circuit boards would normally be employed.

FIG. 2 shows an electroplating form member 22 cast from the mold of FIG. 12. The electroplating form 22 has a set of holes 24 corresponding to the positions of the pegs 18 of FIG. 1. The electroplating form 22 is formed of a conventional investment casting wax or a suitable low melting point insulating material. In practice, the material is poured into the mold of FIG. 1 in liquid form and, after solidification, the mold is heated and turned upside down so that the electroplating form drops out of the mold.

Figure 3:
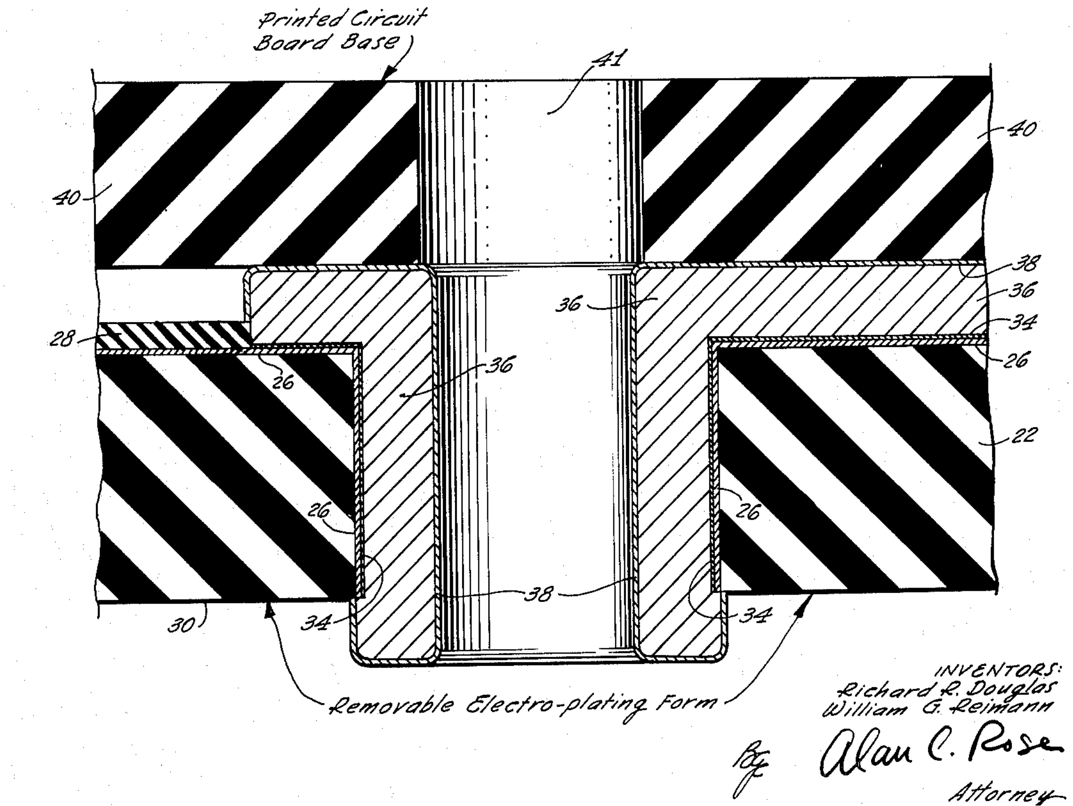
FIG. 3 is a detailed cross-sectional view of an electroplated tube, together with a portion of a conductive strip secured both to the electroplating form and to the printed circuit board base.

A number of successive layers are now applied to the electroplating form 22. These successive steps may best be understood by reference to the showing of FIG. 3. As indicated in FIG. 3, the form 22 is initially coated with a very thin layer 26 of copper. This is accomplished by an initial conventional electroless copper plating process, merely by immersing the form 22 in a commercially available solution, and then electroplating a thin additional layer of copper. The term "electroless" is a contraction of the term "electrodeless," and means that no electrodes or plating current are used in the initial step of the process. The thin layer of copper may be approximately 0.0001 to 0.0002 inch in thickness.

Following the initial copper coating, a layer of "resist" material is applied to some of the area of the copper-plated form which are not to receive further plated layers, and the copper layer is removed from other surfaces. In FIG. 3 the resist material appears at 28 on the upper surface, and the copper coating has been removed mechanically by sanding or grinding from the lower surface 30 of the form 22.

Resist material may be applied by any of several well-known processes. In one of these processes plating resist ink is applied to the electroplating form through a silk screen having a suitable pattern of porous and imporous areas previously established across its surface. Ink passes through the screen in the porous areas, and is blocked in the imporous areas to permit subsequent electroplating on the corresponding areas of the plating form. In accordance with another known technique, the electroplated form may be sprayed with a photo-resist which is commercially available from Eastman-Kodak. Ultraviolet light is then applied to the photo-resist material through a negative. The layer of photo resist hardens where it is struck by the ultraviolet light. When the layer is subsequently washed with a solvent such as trichlorethylene, the areas which have not been hardened by the light are removed and the light hardened areas remain.

Following the application of the resist material 28, 30 and 32, to selected areas of the form 22, a thin layer of gold 34 is electroplated onto the unit. The plating of gold may be very thin; for example 50 millionths of an inch is adequate. In this electroplating step, the gold is only plated onto the exposed areas of copper and does not cover the resist material. Following this treatment, a heavy layer of nickel 36 is electroplated over the gold. The nickel layer would typically be from three to ten thousandths of an inch in thickness, but variations from this thickness would be expected for special applications. The final electroplating step involves the application of an additional thin coating of gold 38 which covers the nickel layer 36. The printed circuit board base member 40 is now secured to the raised electroplated surface of gold-coated nickel which has been developed on the form 22. The hole 41 in the printed circuit board 40 is aligned with the opening through the form 22. In a preferred form of the invention, the holes in the printed circuit board base and in the form 22 follow a standard pattern. However, the printed circuit board and the base members may be formed individually to have matching apertures where such arrangements are desirable or necessary. The circuit board base may be secured to the plated layers by any bonding technique which will result in a firm mechanical interconnection. The base 40 may suitably be formed of a fiberglass epoxy laminate, and may be bonded to the electroplated layers by a dry film adhesive which may be activated by heat and pressure, or by solvent action. Alternatively, an epoxy cement may be employed for bonding.

Once the printed circuit board base member 40 is secured to the electroplated strips, it is desirable to remove the form 22. The form 22 may be made of any of several materials to facilitate its removal. Thus, for example, it may be made of a wax or other low melting point materials so that it can be melted away without damaging the printed circuit board base member 40; alternatively, the form 22 may be made of resilient material so that it may be mechanically separated from the electroplated layers without damaging them.

Following removal of the form 22, the copper layer 26 may also be removed. This is accomplished by an etching step. Conventional solutions employed in this etching step are either ferric chloride or a mixture of chromic and sulphuric acids. The gold layers 34 and 38 prevent any significant attack of the thick nickel layer by the etching solution.

Figure 4:
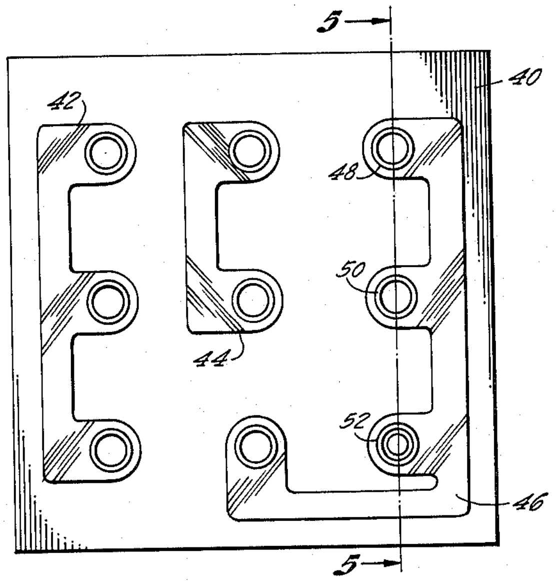
FIG. 4 is a view of a simplified circuit board showing one possible printed circuit pattern.
Figure 5:
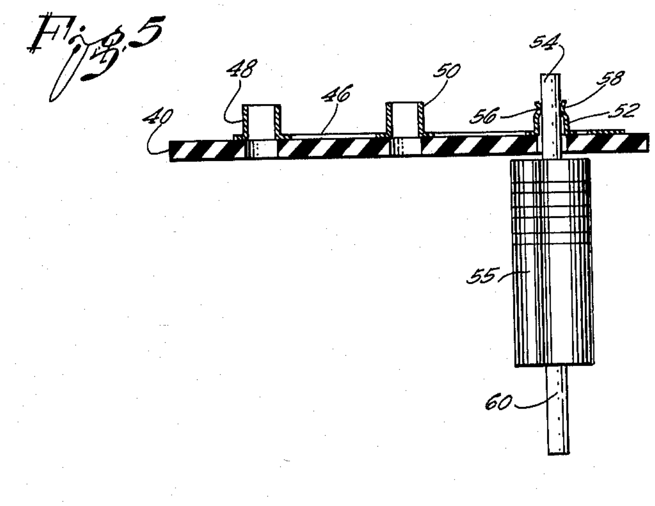
FIG. 5 indicates the technique for welding components to the electroplated tubes formed in accordance with the principles of this invention.

FIGS. 4 and 5 represent the complete circuit board, including base member 40 and electroplated strips 42, 44 and 46 bonded onto a surface of the base member 40. As clearly shown in FIG. 5, the nickel tubes 48, 50 and 52 protrude from the conductive strips 46. These nickel tubes are employed for welding to component leads which extend through the printed circuit boards. By way of example, the upper lead 54 of a resistor 55 is shown welded to tube 52 at points 56 and 58. It is to be understood that other components are welded through the other nickel tubes in a similar manner to form a completed circuit board; similarly, each unit could be provided with a second circuit board for interconnecting the other leads such as lead 60 of resistor 55. The two circuit boards would then be parallel, with electrical components extending between their surfaces, and the resulting module could include transistors, capacitors, resistors and any other components necessary to form conventional electronic circuits.

Now that certain details of one illustrative technique for implementing the invention have been discussed, it is useful to restate some of its advantages. Initially, it is noted that the present invention provides the desirable structural properties of welded circuit connections, while also permitting the use of time-tested printed circuit artwork and design techniques. This is in contrast to welded circuits using tabs, for example, in which special printed circuit design techniques are required. Furthermore, when the protrusion type electroplating forms discussed in the introduction of this specification are employed, conventional photographic or silk screen techniques for applying resist material may not be used.

Additional advantages over the use of a welding form having protrusions include the fact that the surfaces of the electroplated material which are secured to the board and welded to the lead are electrolytically clean, uncontaminated surfaces. This is in contrast to the prior method using an electroplating form having protrusions, where the surfaces in contact with the form may be contaminated as the form is removed; when these same surfaces are secured to the board and welded to component leads, the contamination may impair the bond or the weld.

It should also be noted that the use of welding tubes provides many advantages over the circuit boards which use welding tabs. Thus, when tabs are used, one of the welding electrodes contacts the component lead, which may be of various compositions. Different electrodes are required for various materials, so that either the welding process becomes complex, or the expense of securing standardized lead materials for all components must be incurred. When tubes are employed, however, the welding electrodes only contact the nickel tubes, and a single standard electrode material may be used for all welds.

In the foregoing description, the term "welding tubes" has been employed, and full circular tubes woud normally be employed, in view of the ease of manufacture. However, as used in the present specification and claims, this term is intended to include partial tubes, as long as two opposed surfaces are provided so that the welding electrodes need not contact the component leads directly. In addition, the apertures in the electroplating form may have cross-sectional configurations other than circular, and the tubes or partial tubes would then have corresponding shapes.

It is to be understood that the above-described arrangements are illustrative of the application of the principles of the invention. Numerous other arrangements may be devised by those skilled in the art without departing from the spirit and scope of the invention. Thus, by way of example and not of limitation, the electroplating forms could be made directly by drilling holes into or through a removable electroplating form member. In addition, an electroplating form having protrusions may be employed and the circuit board base members may be secured to the electroplated strips while they are still mounted on the electroplating form, by lowering an apertured base member over the electroplated protrusions; in this case, of course, the welding tubes would extend through and beyond the surface of the printed circuit board base. Concerning another variant, instead of gold, another similar chemically-resistant metal such as platinum could be employed to avoid dissolving the nickel layer during the etching step.

In addition, with regard to inhibiting plating in selected areas, this may be accomplished either by removing the initial electroless plating or by selectively covering it up by resist material, or by any combination of these techniques.

Concerning the removable electroplating form, the use of resilient materials or low melting point materials was noted above; the form may also be made of a material which is soluble in a liquid which will not attack the gold-plated nickel. The electroplating form may also be of a low melting point conductive metal; in this case, with reference to FIG. 3, resist material would be applied to surface 30 and the coating 26 would not be necessary. Accordingly, from the foregoing remarks, it is understood that the present invention is to be limited only by the spirit and scope of the appended claims.

What is claimed is:

1. A process for making a weldable printed circuit board comprising the steps of:

preparing an apertured removable electroplating form,
electroplating tubes through the apertures of said form and electroplating strips interconnecting selected tubes on one surface of said form,
securing a printed circuit board base member to the electroplated conductive material, and
removing said form from the electroplated material and the circuit board base member.

2. A process for making a weldable printed circuit board comprising the steps of:

preparing a removable electroplating form having an extended surface, and also having cylindrical surfaces extending perpendicular to said surface,
electroplating tubes on the cylindrical surfaces of said form and electroplating strips on said surface to interconnect selected tubes,
securing a printed circuit board base member to the electroplated conductive material, and
removing said form from the electroplated material and the circuit board base member.

3. A process for making a weldable printed circuit board comprising the steps of:

preparing a removable electroplating form having an extended surface, and also having cylindrical surfaces extending perpendicular to said surface,
coating portions of said form with an electroplating resist material,
electroplating tubes on the cylindrical surfaces of said form and electroplating strips on said surface to interconnect selected tubes,
securing a printed circuit board base member to the electroplated conductive material, and
removing said form from the electroplated material and the circuit board base member.

4. A process for making a weldable printed circuit board comprising the steps of:

preparing an apertured removable electroplating form,
coating said form with a thin coating of copper,
applying an electroplating resist material to selected areas of said form,
electroplating tubes through the apertures of said form and electroplating strips interconnecting selected tubes on one surface of said form,
securing a printed circuit board base member to the electroplated conductive strips, and
removing said form from the electroplated material and the circuit board base member.

5. A process for making a weldable circuit board comprising the steps of:

preparing a mold having a flat surface and pegs extending into said mold from said surface,
pouring hardenable material into said mold,
removing the resultant molded electroplating form from the mold after the material has hardened,
coating portions of said form with an electroplating resist material,
electroplating tubes of conductive material through the apertures in said form, and electroplating strips on the form to interconnect selected tubes,
securing a printed circuit board base member to the electroplated conductive material, and
removing said form from the electroplated material and the circuit board base member.

6. A process for making a weldable printed circuit board comprising the steps of:

preparing an apertured removable electroplating form,
electroplating nickel tubes through the apertures of said form and electroplating strips interconnecting selected tubes on one surface of said form, securing a printed circuit board base member to the electroplated conductive material, and removing said form from the electroplated material and the circuit board base member.

7. A process for making a weldable printed circuit board comprising the steps of:

preparing an apertured removable electroplating form, electroplating nickel tubes through the apertures of said form and electroplating strips interconnecting selected tubes on one surface of said form, securing a printed circuit board base member to the electroplated conductive material, removing said form from the electroplated material and the circuit board base member, inserting component leads into said nickel tubes, and welding said tubes and leads together.

8. A process for making weldable circuit boards comprising the steps of:

preparing an apertured resilient electroplating form, electroplating tubes through the apertures of said form, and electroplating strips interconnecting selected tubes on one surface of said form, securing a printed circuit board base member to the electroplated conductive material, and subsequently removing the resilient form from the electroplated material and the circuit board base member.

9. A process for making weldable circuit boards comprising the steps of:

preparing an apertured electroplating form of low melting point material, electroplating tubes through the apertures of said form, and electroplating strips interconnecting selected tubes on one surface of said form, securing a printed circuit board base member to the electroplated conductive material, and melting said form away from the electroplated material and the circuit board base member.

10. A process for making weldable circuit boards comprising the steps of:

preparing an apertured soluble electroplating form, electroplating tubes through the apertures of said form, and electroplating strips interconnecting selected tubes on one surface of said form, securing a printed circuit board base member to the electroplated conductive material, and dissolving said soluble form from the electroplated material and the circuit board base member.

11. A process for making weldable printed circuit boards comprising the steps of:

preparing an apertured removable conductive electroplating form, inhibiting the conductivity of selected portions of the outer surface of said form, electroplating tubes through the apertures of said form and electroplating strips interconnecting selected tubes on one surface of said form, securing a printed circuit board base member to the electroplated conductive material, and removing said form from the electroplated material and the circuit board base member.

12. A process for making weldable printed circuit boards comprising the steps of:

preparing an apertured removable insulating electroplating form, applying a thin coating of conductive material to the outer surface of said form, removing the conductive material from selected portions of the outer surface of said form, electroplating tubes through the apertures of said form and electroplating strips interconnecting selected tubes on said form, securing a printed circuit board base member to the electroplated conductive material, and removing said form from the electroplated material and the circuit board base member.

References Cited by the Examiner

UNITED STATES PATENTS

| | | | |
|---|---|---|---|
| 2,955,351 | 10/1960 | McCreadie | 29—155.5 |
| 3,001,104 | 9/1961 | Brown | 317—101 |
| 3,011,247 | 12/1961 | Hanlet | 29—155.5 |
| 3,013,187 | 12/1961 | Wyma et al. | 317—101 |

WHITMORE A. WILTZ, *Primary Examiner.*

JOHN BURNS, *Examiner.*

R. L. GABLE, P. M. COHEN, *Assistant Examiners.*